United States Patent [19]

Lesk et al.

[11] Patent Number: 4,905,070

[45] Date of Patent: Feb. 27, 1990

[54] SEMICONDUCTOR DEVICE EXHIBITING NO DEGRADATION OF LOW CURRENT GAIN

[75] Inventors: Israel A. Lesk, Phoenix; Peter J. Zdebel; Han-Bin K. Liang, both of Mesa, all of Ariz.

[73] Assignee: Motorola, Inc., Schaumburg, Ill.

[21] Appl. No.: 239,879

[22] Filed: Sep. 2, 1988

[51] Int. Cl.$^4$ .................. H01L 49/02; H01L 29/72; H01L 27/02

[52] U.S. Cl. ......................................... 357/51; 357/6; 357/34; 357/86

[58] Field of Search ............................ 357/6, 34, 52, 86

[56] References Cited

U.S. PATENT DOCUMENTS

| | | |
|---|---|---|
| 3,979,613 | 9/1976 | Kroger et al. ................... 357/52 |
| 4,000,506 | 12/1976 | Hirai et al. ........................ 357/34 |
| 4,009,483 | 2/1977 | Clark ................................ 357/34 |
| 4,142,112 | 2/1979 | Kroger ............................... 357/6 |
| 4,288,776 | 9/1981 | Holmes ............................ 357/51 |
| 4,786,612 | 11/1988 | Yau et al. ......................... 357/51 |

FOREIGN PATENT DOCUMENTS

| | | |
|---|---|---|
| 56-64460 | 12/1981 | Japan . |
| 62-291956 | 12/1987 | Japan ............................... 357/51 |

Primary Examiner—J. Carroll
Attorney, Agent, or Firm—Joe E. Barbee

[57] ABSTRACT

The degradation of the low current gain, which is exhibited during emitter-base reverse bias breakdown testing, is prevented by providing an emitter-base resistive shunt on the surface. This resistive shunt, preferably made of silicon nitride. utilizes surface recombination to reduce the low current gain permanently, thus a degradation is not exhibited upon testing.

9 Claims, 1 Drawing Sheet 4,905,070

SEMICONDUCTOR DEVICE EXHIBITING NO DEGRADATION OF LOW CURRENT GAIN

BACKGROUND OF THE INVENTION

This invention relates, in general, to semiconductor devices, and more particularly, to a method of making a bipolar transistor with improved low current gain.

A well known problem that exists in bipolar transistors is the degradation of the gain at low currents. Low current gain degradation is exhibited when the emitter-base P-N junction is under reverse bias breakdown testing, or ageing. The reverse bias emitter-base P-N junction ageing induced reduction of low current gain is due to minority carrier base current lost by an increase in surface recombination. This degradation can also occur when a carrier recombination current is generated in the emitter-base junction transition region in the bulk. Although this degradation of the gain at low currents is not detrimental to the operation of the device for many applications, it is considered to be an indication of poor reliability and instability. A degradation of the gain is also exhibited at high currents when a surface channel is formed parallel to the emitter-base region.

An apparent reduction in the amount of degradation of the gain at low currents has been achieved by the use of shunts, both external and internal to the semiconductor device. These shunts, however, do not affect the high current gain degradation. An internal shunt is commonly an emitter-base resistive shunt deposited on a thermal oxide, which overlays the emitter-base junction, and is connected to emitter and base metal. High value thin film resistors, such as amorphous silicon, have been used as the resistive shunt. One of the problems that arises is that considerable additional processing steps are necessary to incorporate such resistive shunts on the silicon dioxide layer of some integrated circuit structures. In addition, if amorphous silicon is used, subsequent processing temperatures must be kept low in order to avoid the crystallization of the amorphous silicon.

By now it should be appreciated that it would be advantageous to provide a bipolar transistor which exhibits no degradation of low current gain and is simple to manufacture.

Accordingly, it is an object of the present invention to provide an improved bipolar transistor exhibiting no degradation of the low current gain under reverse bias breakdown testing.

Another object of the present invention is to provide a bipolar transistor wherein the formation of a surface channel is prevented.

A further object of the present invention is to provide a bipolar transistor having stable emitter-base characteristics fabricated with minimal additional processing steps.

Yet another object of the present invention is to provide a bipolar transistor with a shunt which prevents reverse bias emitter-base P-N junction ageing induced reduction of low current gain.

SUMMARY OF THE INVENTION

In accordance with the present invention, the above and other objects and advantages are provided by the use of an emitter-base shunt on the silicon surface. Under reverse bias emitter-base breakdown testing or ageing, a bipolar transistor will exhibit a drop-off or degradation in the low current gain. The emitter-base shunt, a high value thin film resistor such as silicon nitride, provides for the permanent reduction of the low current gain. The high recombination velocity of the silicon-silicon nitride interface is utilized to reduce the gain permanently, thus a degradation is not exhibited during testing.

The preferred embodiments of the invention are illustrated in the accompanying drawings for purposes of exemplification, and are not to be construed as limiting in any manner.

DETAILED DESCRIPTION OF THE DRAWINGS

Figure 1:
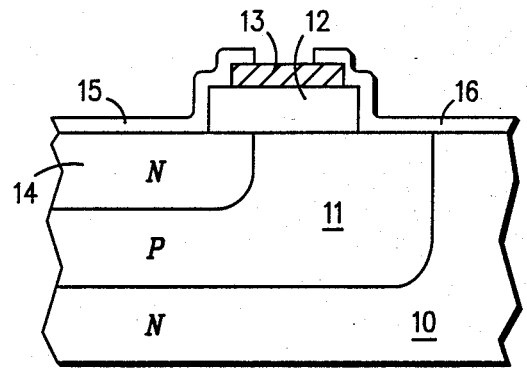
FIG. 1 illustrates a cross-sectional view of a portion of a bipolar transistor made in accordance with the prior art.

FIG. 1 illustrates a cross-sectional view of a portion of an NPN bipolar transistor 9 embodying the prior art. An N-type semiconductor substrate 10 is shown with a P-type base 11 and an N-type emitter 14. Silicon dioxide spacer 12 overlays the edges of emitter 14 and base 11. A resistive shunt 13 is placed on silicon dioxide 12, and is tied to an emitter metal 15 and a base metal 16. Resistive shunt 13 is typically made of amorphous silicon. The problem with this type of shunt is that the additional processing steps are cumbersome and difficult to incorporate into some processing flows, and high current gain can still be degraded by emitter-base reverse bias ageing as it is in transistors without this type of shunt.

Figure 2A:
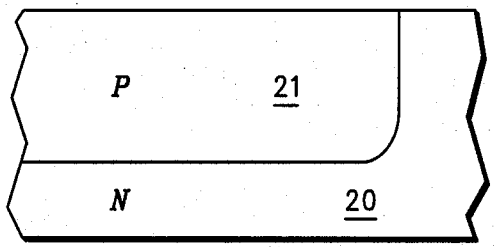
FIGS. 2A-2D illustrate a cross-sectional view of a portion of a bipolar transistor made in accordance with the present invention.

FIG. 2A illustrates a cross-sectional view of a bipolar transistor 19 at a beginning stage of processing. Shown is an N-type semiconductor substrate 20 with a P-type base 21. Various ways to achieve such structures are well known in the art. The fabrication of a simple NPN bipolar transistor will be further described, however, the present invention can be used in more complicated transistor fabrication. The cross-sectional view in FIGS. 2A-2D can be either a discrete transistor or part of an integrated circuit comprising many transistors. Note also that the present invention would apply to other types of devices, such as PNP bipolar transistors, thyristors, and the like.

Figure 2B:
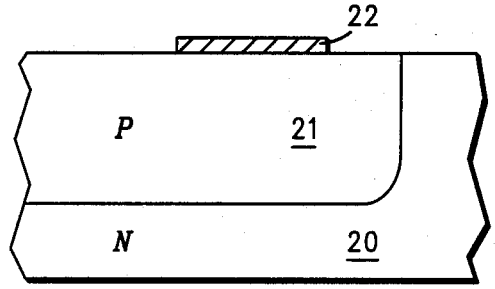

FIG. 2B illustrates the structure of FIG. 2A with a patterned layer of a silicon nitride 22 over a portion of base 21. Silicon nitride layer 22 is formed by depositing silicon nitride on the surface of transistor 19, and then subsequently patterning and etching using standard photolithography techniques. The thickness of silicon nitride layer 22 is preferably approximately 100 to 1000 angstroms. A thin layer of silicon nitride 22 is desired in order to prevent the generation of stress and concomitant structural damage to the surface of the substrate. Another type of resistive film, such as amorphous silicon, may be used, however, silicon nitride can withstand higher processing temperatures.

Figure 2C:
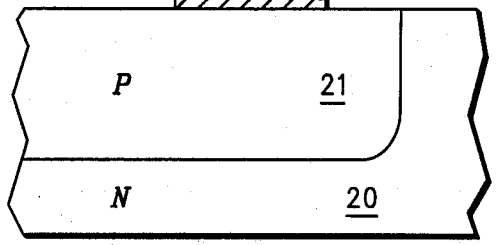

FIG. 2C illustrates the structure of FIG. 2B with the addition of a patterned silicon dioxide layer 23. Silicon dioxide layer 23 is formed by depositing a layer of silicon dioxide on the surface of transistor 19 and silicon nitride layer 22, then subsequently patterning and etching using standard photolithography techniques.

Figure 2D:
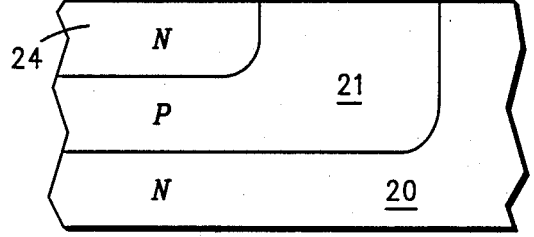

FIG. 2D illustrates the structure of FIG. 2C with an emitter region 24 of N-type conductivity. Various methods can be used to obtain emitter region 24, such as ion implantation or chemical deposition and then a diffusion. Another method would be to deposit a doped polysilicon (not shown) on the surface of emitter region 24 and then drive some of the dopant into base region 21 to form emitter region 24. Silicon dioxide layer 23 acts as a spacer and a mask between the contact region of emitter 24 and the contact region of base 21. If silicon nitride layer 22 is thick enough to prevent the dopant used to form emitter region 24 from penetrating through it to the semiconductor substrate, then silicon dioxide layer 23 will not be necessary. Another layer of silicon nitride may also be deposited instead of silicon dioxide layer 23.

The emitter 24-base 21/silicon nitride 22 interface has a high recombination velocity which reduces the low current gain permanently, thus no degradation is exhibited over time during testing. In addition, since silicon nitride layer 22 exhibits bulk controlled conduction, any charge introduced into it will relax in a time characterized by the dielectric relaxation time of silicon nitride. Since a permanent charge is not built up, a surface channel parallel to the emitter 24-base 21 junction will not form. If this surface channel is not generated, a degradation in the high current gain may also be prevented. Charge is built up in the silicon dioxide layer 12, as shown in FIG. 1 of the prior art, because silicon dioxide exhibits contact controlled conduction. Current flow in silicon dioxide is limited by the substrate material, substrate doping, or the polarity of the electrodes at the silicon/silicon dioxide interface. Since conduction through the silicon nitride is bulk controlled, current flow is essentially independent of these parameters. Thus, a surface channel is formed in the prior art structure shown in FIG. 1, and high current gain can still be degraded.

The resistivity of silicon nitride layer 22 is preferably approximately $10^{15}$ to $10^{17}$ ohm-cm. If stability at higher levels of current testing is desired, then a lower resistivity of silicon nitride can be deposited by making it more silicon rich. A silicon nitride layer 22 having a lower resistivity will relax a charge introduced into it in a shorter time.

Subsequent processing is well known in the art and therefore will not be further described. Since this process requires the addition of only one step in the interface dielectric, those skilled in the art will recognize that it is easy to incorporate into many transistor process flows.

By now it should be appreciated that there has been provided a bipolar transistor providing improved emitter-base characteristics. This is accomplished by an additional step of adding a resistive shunt on the surface overlaying the emitter-base P-N junction.

We claim:

1. An integrated semiconductor device comprising:
   a semiconductor substrate of a first conductivity type having a surface, a first doped region of opposite conductivity type than the substrate, and a second doped region of the first conductivity type inside the first doped region; and
   a resistive film disposed on the surface of the substrate partially overlaying the first and second doped regions, wherein the resistive film acts as a shunt which prevents a degradation of low current gain.

2. The semiconductor device of claim 1 wherein the resistive film is silicon nitride.

3. The semiconductor device of claim 2 wherein the silicon nitride is approximately 100-1000 angstroms in thickness, and wherein the resistivity of the silicon nitride is approximately $10^{15}$ to $10^{17}$ ohm-cm.

4. The semiconductor device of claim 1, further comprising a silicon dioxide layer disposed on at least the resistive film.

5. A bipolar transistor comprising:
   a semiconductor substrate having a top surface, a collector region of a first conductivity type, a base region of a second conductivity type, and an emitter region of the first conductivity type disposed in the base region, and wherein the base, emitter, and collector regions extend to the top surface of the semiconductor substrate; and
   a silicon nitride layer disposed on the surface of the semiconductor substrate partially overlaying the emitter and base regions wherein the silicon nitride prevents a degradation of current gain.

6. The bipolar transistor of claim 5 wherein the silicon nitride layer is approximately 100-1000 angstroms in thickness, and wherein the resistivity of the silicon nitride is approximately $10^{15}$ to $10^{17}$ ohm-cm.

7. The bipolar transistor of claim 5 further comprising a layer of silicon dioxide disposed on at least the silicon nitride layer.

8. An integrated semiconductor device having improved gain, comprising:
   a semiconductor substrate; a P-N junction formed in the substrate; and a resistive surface shunt positioned on the substrate to overlap the P-N junction to prevent a surface channel from forming and to prevent reverse bias P-N junction ageing induced reduction of low and high current gain.

9. The semiconductor device of claim 8 wherein the resistive shunt is a silicon nitride shunt.

* * * * *